United States Patent [19]

Furutani et al.

[11] Patent Number: 4,710,789

[45] Date of Patent: Dec. 1, 1987

[54] SEMICONDUCTOR MEMORY DEVICE

[75] Inventors: Kiyohiro Furutani; Koichiro Mashiko; Kazutami Arimoto, all of Itami, Japan

[73] Assignee: Mitsubishi Denki Kabushiki Kaisha, Tokyo, Japan

[21] Appl. No.: 937,206

[22] Filed: Dec. 3, 1986

[30] Foreign Application Priority Data

Jan. 30, 1986 [JP] Japan .................................. 61-20614

[51] Int. Cl.$^4$ ............................................. H01L 29/78
[52] U.S. Cl. .................................... 357/23.6; 357/42; 365/190; 365/51
[58] Field of Search ................. 357/23.6, 42; 365/190, 365/51

[56] References Cited

U.S. PATENT DOCUMENTS

| | | | |
|---|---|---|---|
| 4,545,037 | 10/1985 | Nakano et al. | 357/23.6 |
| 4,604,639 | 8/1986 | Kinoshita | 357/23.6 |
| 4,641,166 | 2/1987 | Takemae et al. | 357/23.6 |

OTHER PUBLICATIONS

Kunio Nakamura et al., "Buried Isolation Capacitor (BIC) Cell for Megabit MOS Dynamic RAM", IDEM 84, pp. 236-239.

Primary Examiner—Martin H. Edlow
Assistant Examiner—David R. Josephs
Attorney, Agent, or Firm—Saidman, Sterne, Kessler & Goldstein

[57] ABSTRACT

In a semiconductor memory device, memory cells of a first column each comprising an N-channel FET are connected to a first bit line, and memory cells of a second column each comprising a P-channel FET are connected to a second bit line. The first bit line and the second bit line are connected to complementary terminals of a sense amplifier to form a folded-bit line pair. A work line is connected to the gate of the N-channel FET of one of the memory cells of the first column and to the gate of the P-channel FET of one of the memory cells of the second column. The word line is selectively provided with a first voltage to make conductive the N-channel FET connected thereto and to make nonconductive the P-channel FET connected thereto, or a second voltage to make conductive the P-channel FET connected thereto and to make nonconductive the N-channel FET connected thereto, or a third voltage to make nonconducitve both the N-channel FET and the P-channel FET connected thereto.

5 Claims, 4 Drawing Figures

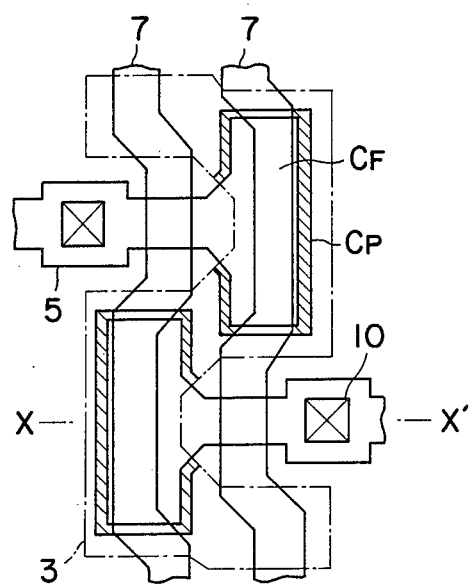
F I G. I A  PRIOR ART
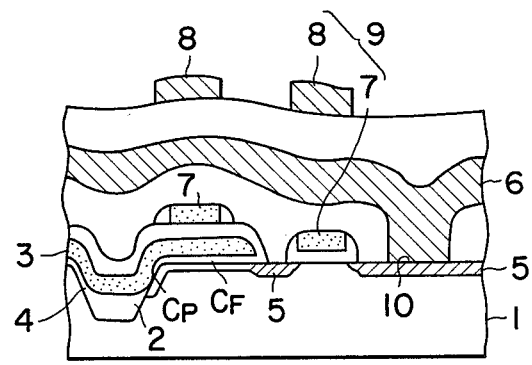
F I G. I B  PRIOR ART

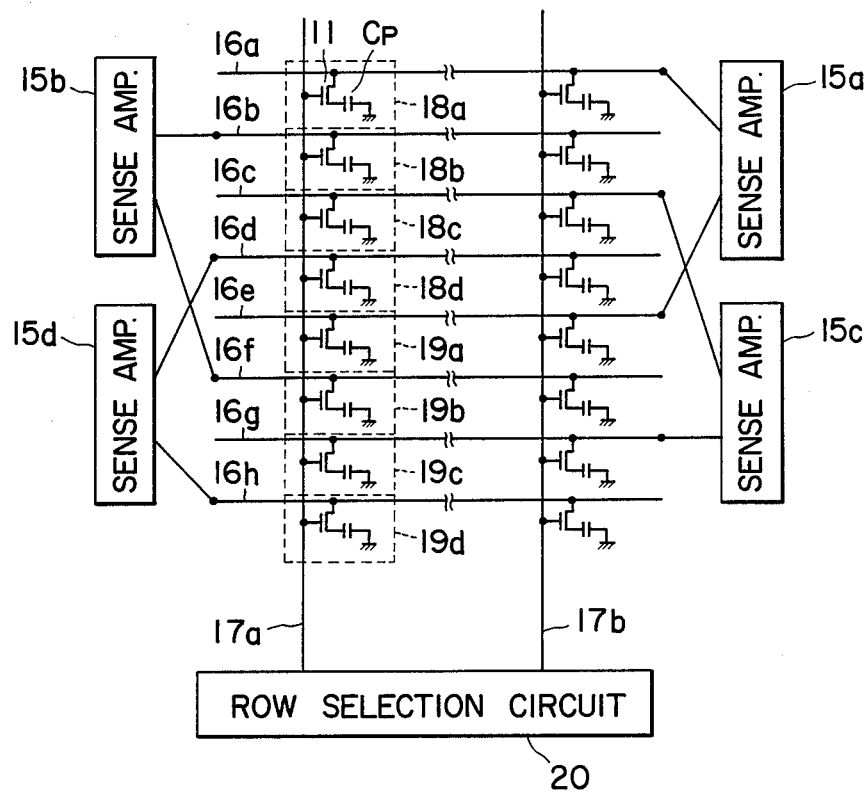
F I G. 3

SEMICONDUCTOR MEMORY DEVICE

BACKGROUND OF THE INVENTION

The present invention relates to a semiconductor memory device, particularly one with a memory cell organization suitable for higher integration.

An example of a memory cell organization of a highely integrated dynamic semiconductor memory device as proposed in the lecture Number FAM 17.4 of ISSCC 85 is shown in FIGS. 1A and 1B. As illustrated, it comprises a p-type semiconductor substrate 1, a field oxide film 2, a first poly-silicon layer 3, a capacitor insulating film 4, an n+ diffusion layer 5, a first Al interconnection layer 6 forming bit lines and a second poly-silicon layer 7 forming word lines 9. Although not illustrated as such, the second poly-silicon layer 7 is electrically connected at regular intervals with the second Al interconnection layer 8 to reduce the effective resistance of the word line 9. Contact holes 10 are for electrical connection of the first Al interconnection layer 6 to the n+ diffusion layer 5. Cp represents a data charge storage capacitance formed of the poly-silicon 3 and the n+ diffusion layer 5 on the respective sides of the capacitor insulating film 4, on the sidewall of an isolation trench. Cf represents a data charge storage capacitor formed of the poly-silicon 3 and the n+ diffusion layer 5 on the respective sides of the capacitor insulating film 4, on the flat part.

By utilizing the sidewall of the isolation trench for forming a data charge storage capacitance Cp, the area for the data charge storage capacitance Cf on the flat part can be reduced. As a result, the reduction in the chip area does not lead to reduction in operation margin and makes it possible to provide data storage capacitance for securing the stored data charge against minority carriers injected because of radiation such as alpha particles. As longer periphery of the memory cells is utilized, the trench may be made shallower to obtain the same data charge storage capacitance Cp+Cf.

In a conventional highly-integrated dynamic semiconductor memory of a folded-bit line configuration and having the above-described memory cells in which data charge storage capacitance are formed on sidewalls of the isolation trenches, an area necessary for forming each memory cell (for one bit) comprises an area for ½ contact hole (one contact is shared by two memory cells) and an area for two word lines. However, where the data charge storage capacitance Cp on the sidewalls of the isolation trenches are enlarged by forming deep isolation trenches to reduce the data charge storage capacitances Cf on the flat part in an attempt to increase the degree of integration, it then becomes difficult to secure the area for disposing two word lines. Thus, a restriction on the designing is imposed.

SUMMARY OF THE INVENTION

An object of the invention is to provide a semiconductor memory device with which the restriction on the designing is eliminated even if the data charge storage capacitances on the sidewalls of the isolation trenches are enlarged and the area of the flat part is reduced.

According to the invention, there is provided a semiconductor memory device comprising a plurality of memory cells arranged in rows and columns to form a matrix, a first bit line to which memory cells of a first column are connected, each of the memory cells of the first column comprising an N-channel FET and capacitance means, a second bit line to which memory cells of a second column are connected, each of the memory cells of the second column comprising a P-channel FET and capacitance means, the first bit line and the second bit line being connected to complementary terminals of a sense amplifier to form a folded-bit line pair, a word line connected to the gate of the N-channel FET of one of the memory cells of the first column and to the gate of the P-channel FET of one of the memory cells of the second column, and means selectively providing the word line with a first voltage to make conductive the N-channel FET connected thereto and to make nonconductive the P-channel FET connected thereto, or a second voltage to make conductive the P-channel FET connected thereto and to make nonconductive the N-channel FET connected thereto, or a third voltage to make nonconductive both the N-channel FET and the P-channel FET connected thereto.

BRIEF DESCRIPTION OF THE DRAWINGS

In the accompanying drawings:

FIG. 1A is a plan view of a part of a conventional semiconductor memory device;

FIG. 1B is a cross section along the line X-X' in FIG. 1A;

FIG. 3 is a circuit diagram showing how the memory cells are connected.

DETAILED DESCRIPTION OF THE PREFERRED EMBODIMENTS

Figure 2:
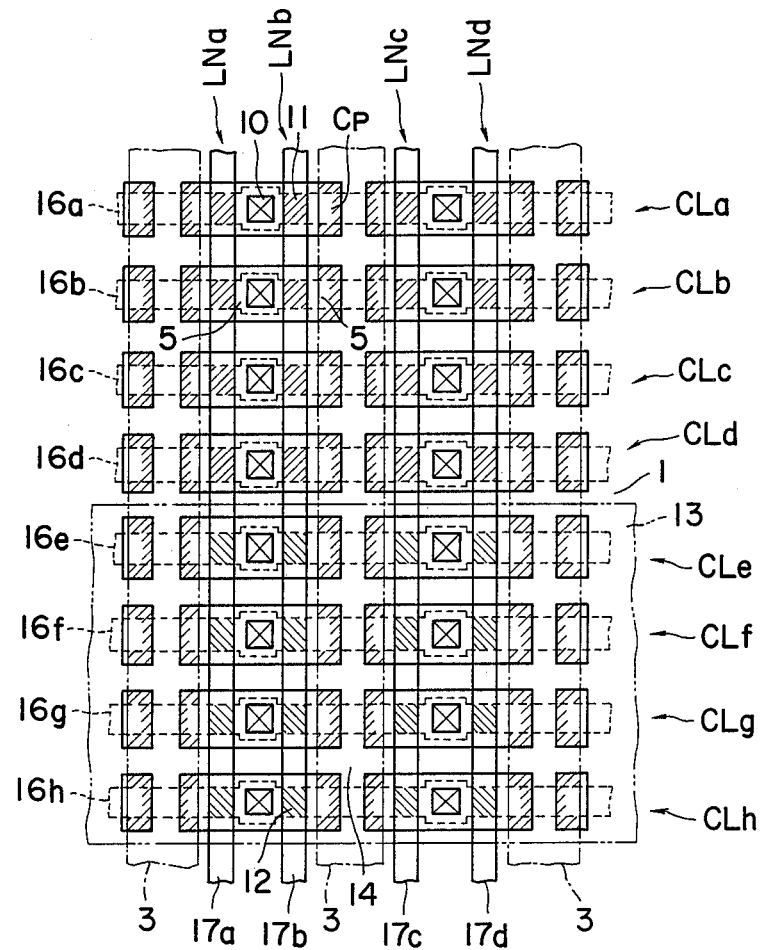
FIG. 2 is a plan view showing a part of a semiconductor memory device of an embodiment of the invention.

FIG. 2 shows a part of a semiconductor memory device of an embodiment of the invention. The same reference numerals as in FIGS. 1A and 1B denote indentical or similar members or parts. As illustrated, isolation trenches 14 are formed to surround each pair of memory cells sharing a contact hole 10 and having MOSFETs with channel part 11 or 12, and storage capacitors formed at least partially of the capacitances Cp on the sidewalls of the isolation trenches 14. As illustrated, the memory cells are arranged, in columns which extend horizontally as viewed in FIG. 2. Only some of the columns CLa through CLh are illustrated, and they are shown to be respectively associated with bit lines 16a through 16h. The memory cells of each column are all connected to the associated bit line (e.g., one of the bit lines 16a through 16h) through the contact holes 10.

According to the invention, memory cells of some of the columns, such as CLa through CLd, comprise an N-channel MOSFET having the channel part 11 and formed directly on the P-type substrate 1, while memory cells of some of the columns, such as CLe through CLh comprise a P-channel MOSFET having the channel part 12 and formed on a n-well 13 which is formed in the substrate 1.

In the embodiment illustrated, memory cells of four adjacent columns comprise N-channel MOSFETs, and memory cells of the next four columns comprise P-channel MOSFETs and memory cells of the next four columns again comprise N-channel MOSFETs, and so on. In other words, the conductivity type of the MOSFETs of the memory cells is alternated every four columns. In the region where the n-channel MOSFETs are formed, each of the data charge storage capacitances Cp is formed of the n+ diffusion layer 5 and poly-silicon 3 on the sidewall of the isolation trench. In the region where the P-channel MOSFETs are formed, each of the data charge storage capacitances Cp is formed of a p+ diffusion layer and the poly-silicon on the sidewall of the isolation trench.

Memory cells are also arranged in lines orthogonal to the columns. Only some of the lines LNa through LNd are illustrated, and they are shown to be respectively associated with word lines 17a through 17d. The gates of the MOSFETs of the memory cells of each line are all connected to the associated word line (e.g., one of the word lines 17a through 17d).

FIG. 3 shows electrical connection of the memory cells, together with sense amplifiers 15a through 15d. More particularly, pairs of bit lines 16a, 16e; 16d, 16f; 16c, 16g; and 16d, 16h are respectively connected to the complementary data terminals of the sense amplifiers 15a through 15d to form a folded-bit line configuration. In FIG. 3, memory cells in the line LNa are shown in detail and they are denoted by reference numerals 18a through 18d and 19a through 19d. The memory cells 18a through 18d are the ones each comprising an N-channel MOSFET, while the memory cells 19a through 19d are the ones each comprising a P-channel MOSFET. The N-channel MOSFETs are of the enhancement type and have a positive threshold voltage, e.g., 4 V. The P-channel MOSFETs are of the enhancement type and have a negative threshold voltage, e.g., −4 V.

The word lines 17a through 17d are connected to a row selector circuit 20. The row selection circuit 20 provides each of the word lines 17a through 17d either a first voltage making conductive all the N-channel MOSFETs connected thereto and making nonconductive all the P-channel MOSFETs connected thereto, or a second voltage making conductive all the P-channel MOSFETs connected thereto and making nonconductive all the N-channel MOSFETs connected thereto, or a third voltage maing nonconductive all the N-channel and P-channel MOSFETs connected thereto.

Where the "H" level as stored in the data charge storage capacitances Cp is at 5 V, and the "L" level as stored in the data charge storage capacitances Cp is at OV, the above mentioned first, second and third voltages are for example 9 V, −4 V and 2.5 V, respectively.

When the third voltage, e.g., 2.5 V is applied to a word line e.g., 17a, all of the N-channel and the P-channel MOSFETs are nonconductive, so that none of these memory cells are accessed. That is, writing into and reading out of the memory cells are not made and the data in the memory cells, e.g., 18a through 18d and 19a through 19d, are maintained.

When the first voltage is applied to the word line 17a, the N-channel MOSFETs of the memory cells 18a through 18d are made conductive, while the P-channel MOSFETs of the memory cells 19a through 19d are nonconductive, so that the memory cells 18a through 18d incorporating the N-channel MOSFETs are accessed, while the data in the memory cells 19a through 19d are maintained.

When the second voltage is applied to the word line 17a, the P-channel MOSFETs of the memory cells 19a through 19d are made conductive while the N-channel MOSFETs of the memory cells 18a through 18d are nonconductive, so that the memory cells 19a through 19d incorporating the P-channel MOSFETs are accessed while the data in the memory cells 18a through 18d are maintained.

In this way, by selective application of the first, the second or the third voltage to a word line, the row selection circuit 20 selects either the group of N-channel MOSFETs connected to the word line, or the group of P-channel MOSFETs connected to the word line, or does not select any of the N-channel and the P-channel MOSFETs connected to the word line. Since the selection can be made between the group of N-channel MOSFETs and the group of P-channel MOSFETs, each group of the MOSFETs may be considered to form one row, from a viewpoint of selection or selective access, by a row selection circuit 20. Thus, two "rows" of memory cells are considered to be arranged along a single line. These two rows of memory cells are selectively accessed by a single word line, with the use of the three level signal.

It is therefore only necessary for each memory cell to have an area for passage of a single word line. The area per memory cell, particularly the area of the flat part can be reduced. Accordingly, the restriction on the designing is removed and the degree of integration can be increased. As a result, even if the trenches are deepened and the capacitances Cp on the sidewalls of the trenches are enlarged and the capacitances Cf on the flat parts are reduced, there does not occur the problem of insufficient area for the word lines.

As was mentioned, the two rows of the memory cells connected to the same word line are not selected simultaneously. In other words, the N-channel MOSFETs connected to the bit lines 16a through 16d and the P-channel MOSFETs connected to the bit lines 16e through 16h do not conduct simultaneously. Therefore, it can be so arranged that one of the bit lines 16a through 16d to which memory cells having N-channel MOSFETs are connected, and one of the bit lines 16e through 16h to which memory cells having P-channel MOSFETs are connected, are connected to complementary data terminals of a sense amplifier to form a folded-bit line pair. In the illustrated example, the bit line 16a connected to the first (as counted from the top) of the four columns of memory cells having N-channel MOSFETs and the bit line 16e connected to the first (as counted from the top) of the column of memory cells having P-channel MOSFETs are connected to the same sense amplifier 15a to form a bit line pair. Similarly, the second bit lines 16b and 16f are connected to form a bit line pair. Similarly, the third bit lines 16c and 16g form another pair, and fourth bit lines 16d and 16b form another pair.

In a memory cell array of the folded-bit line configuration, when a memory cell connected to one bit line of a bit line pair is selected, a dummy memory cell connected to the other bit line of the same bit line pair is selected simultaneously, and the potentials on the bit lines are compared and amplified by the sense amplifier. Thus, from the viewpoint of operation of the bit lines, the memory device operate In a manner similar to the operation of the conventional memory device of a folded-bit line configuration. The memory device of the invention differs in the unique arrangement of the rows of the memory cells, and the selective application of three level signal to the word lines, so that each word line can be shared by two rows of memory cells.

In the embodiment described, an N-well 13 is formed in a P-type substrate 1 and the memory cells having N-channel MOSFETs are formed directly on the substrate 1, while the memory cells having the P-channel MOSFETs are formed on the N-well 13. Alternatively, it may be so arranged that a P-well is formed in an N-type substrate and the memory cells having N-channel MOSFETs are formed on the P-well, while the memory cells having P-channel MOSFETs are formed directly on the N-type substrate. Still alternatively, twin-tub configuration may be used.

In the embodiment described, the conductivity type of the MOSFETs of the memory cells is alternated at an interval of four columns. But, this may be alternated at any desired number of columns.

What is claimed is:

1. A semiconductor memory device comprising
a plurality of memory cells arranged in rows and columns to form a matrix,
a first bit line to which memory cells of a first column are connected, each of the memory cells of the first column comprising an N-channel FET and capacitance means,
a second bit line to which memory cells of a second column are connected, each of the memory cells of the second column comprising a P-channel FET and capacitance means,
the first bit line and the second bit line being connected to complementary terminals of a sense amplifier to form a folded-bit line pair,
a word line connected to the gate of the N-channel FET of one of the memory cells of the first column and to the gate of the P-channel FET of one of the memory cells of the second column, and
means selectively providing the word line with a first voltage to make conductive the N-channel FET connected thereto and to make nonconductive the P-channel FET connected thereto, or a second voltage to make conductive the P-channel FET connected thereto and make nonconductive the N-channel FET connected thereto, or a third voltage to make nonconductive both the N-channel FET and the P-channel FET connected thereto.

2. A device according to claim 1, wherein a certain number of columns of memory cells having N-channel MOSFETs and the same number of columns of memory cells having P-channel MOSFETs are arranged alternately.

3. A device according to claim 2, wherein a P-type semiconductor region is formed to span the said certain number of columns with the memory cells having the N-channel MOSFETs and an N-type semiconductor region is formed to span the said certain number of columns with the memory cells having the P-channel MOSFETs.

4. A device according to claim 1, wherein the memory cells are arranged in lines orthogonal to the columns, the gates of the MOSFETs of the memory cells arranged in one of the lines are all connected to the same word line.

5. A device according to claim 1, wherein an isolation trench is formed to surround each pair of memory cells sharing a contact hole, each memory cell having a storage capacitor formed at least partially of the capacitance on the sidewall of the isolation trench.

* * * * *